United States Patent [19]

Jon et al.

[11] Patent Number: 5,903,220
[45] Date of Patent: May 11, 1999

[54] ELECTROSTATIC DISCHARGE EVENT DETECTOR

[75] Inventors: Min-Chung Jon, Princeton Junction; Vito Palazzo, Hamilton Township, both of N.J.

[73] Assignee: Lucent Technologies Inc., Murray Hill, N.J.

[21] Appl. No.: 08/842,920

[22] Filed: Apr. 17, 1997

[51] Int. Cl.⁶ ............................................. G08B 17/12
[52] U.S. Cl. .................... 340/600; 340/635; 340/649; 324/72; 324/457
[58] Field of Search .................... 340/600, 635, 340/657, 649; 324/207.16, 509, 457, 458, 227, 72.5, 76.13, 76.16, 95, 102, 106

[56] References Cited

U.S. PATENT DOCUMENTS

| | | | |
|---|---|---|---|
| 4,249,131 | 2/1981 | Owen | 324/452 |
| 4,386,315 | 5/1983 | Young et al. | 324/120 |
| 4,631,473 | 12/1986 | Honda | 324/72.5 |
| 4,714,915 | 12/1987 | Hascal et al. | 340/657 |
| 4,926,285 | 5/1990 | Reinhardt et al. | 361/230 |
| 4,975,686 | 12/1990 | Delcourt | 340/659 |
| 5,123,102 | 6/1992 | Puckette | 395/550 |
| 5,128,622 | 7/1992 | Masuda et al. | 324/682 |
| 5,138,380 | 8/1992 | Umeda et al. | 355/208 |
| 5,166,624 | 11/1992 | Abernathy | 324/542 |
| 5,182,596 | 1/1993 | Nakazawa et al. | 355/203 |
| 5,315,255 | 5/1994 | Bettinger | 324/457 |
| 5,359,319 | 10/1994 | Campbell et al. | 340/649 |
| 5,376,879 | 12/1994 | Schrimpf et al. | 324/72 |
| 5,461,369 | 10/1995 | Campbell et al. | 340/649 |
| 5,463,379 | 10/1995 | Campbell et al. | 340/657 |
| 5,488,301 | 1/1996 | Werner, Jr. et al. | 324/458 |
| 5,509,036 | 4/1996 | Nakata | 375/368 |

OTHER PUBLICATIONS

"Electromagnetic Field in the Vicinity of Low Voltage ESD Wave Source: Unipolarity and Ultra–Widewand," M. Honda., 1990 EOS/ESD Symposium Proceeings, pp. 107–110.

"ESD Process Control & Measurement," J. D. Campbell, Reprinted from EMC Test & Design, Sep./Oct. 1992, 5 page copies unnumbered.

"Static Event Detection System," Product Sheet, 3M Company distribution, pp. 1–7.

*Primary Examiner*—Jeffery A. Hofsass
*Assistant Examiner*—Toan N. Pham
*Attorney, Agent, or Firm*—Steven R. Bartholomew

[57] ABSTRACT

Detection of the existence, magnitude, and frequency of occurrence of a plurality of ESD events is achieved by using an envelope detector to process signals generated by ESD events and received by an antenna. The ESD event detector includes an antenna for producing a signal waveform in response to electromagnetic fields incident thereupon, a demodulator coupled to the antenna for generating an envelope waveform that is related to the envelope of the signal waveform, a threshold window discriminator coupled to the demodulator for generating an indication signal if the envelope detected by the demodulator has a magnitude between a first and a second threshold, and a counter coupled to the threshold window discriminator for counting the number of indication signals received from the threshold window detector.

30 Claims, 2 Drawing Sheets

ELECTROSTATIC DISCHARGE EVENT DETECTOR

BACKGROUND

1. Field of the Invention

This invention is related to electronic measurement devices, and more particularly to electrostatic discharge event detectors.

2. Background Art

Electrostatic discharge (ESD) events may cause damage to electronic semiconductor components. ESD is a well-known problem in the operational environment of electronic circuit board assembly lines. In the past, ESD has been controlled by requiring human operators to wear grounded wrist straps. However, current automation trends have replaced human operators with robotic assembly equipment that uses insulative composite materials and ungrounded metal parts. Such equipment, including, for example, pick-and-place machines and IC testers, is difficult to analyze for susceptibility to ESD problems. It is quite time-consuming, if not altogether impossible, for engineers in factories to certify automated machines for ESD-free operation. The engineers must be able to detect occurrences of ESD events in order to apply the appropriate ESD mitigation methods to a given machine. This task is important because ESD events that take place in the context of automated machines are oftentimes of sufficient magnitude so as to damage one or more electronic components on a circuit board.

Presently-existing ESD event detectors, an example of which is disclosed in U.S. Pat. No. 4,631,473 issued to Masamitsu Honda on Dec. 23, 1986 and entitled, Transient Electromagnetic Field Detector", provide a momentary indication of the existence of an ESD event at the time that the event is actually taking place. This momentary indication takes the form of an audible beep or a flash of light emitted by an indicator lamp or LED. A human operator must be present at the time that an ESD event triggers the detector, or else information as to the occurrence of an ESD event is lost.

Prior-art ESD event detectors trigger an ESD indication whenever a received signal waveform has an amplitude above a predetermined threshold, irrespective of how many ESD events the received signal waveform actually represents. A single ESD event produces electromagnetic radiation which may be reflected by nearby metallic objects, resulting in the receipt of several signal peaks above a predetermined threshold. Unfortunately, existing ESD detectors are unable to distinguish a multi-peak waveform representing a single ESD event from a waveform that represents several ESD events. Moreover, existing ESD detectors provide no information about relative magnitudes of a plurality of ESD events, or the number of ESD events that occur within a given period of time. Such information is critical in determining the relative effectiveness of various proposed methods of ESD mitigation in environments where electronic devices are assembled and used.

SUMMARY OF THE INVENTION

Detection of the existence, relative magnitude, and relative time of occurrence, of ESD events is achieved in an ESD event detector by using an envelope demodulator for processing a received signal waveform so as to distinguish a waveform generated by a single ESD event from waveforms generated by a plurality of ESD events and waveforms that are not generated by ESD events. The ESD event detector includes an antenna, an envelope demodulator for generating an envelope waveform that is related to the envelope of signals received by the antenna, a discriminator for generating an indication signal if the envelope waveform has a magnitude between a first and a second threshold, and a counter for counting indication signals.

DETAILED DESCRIPTION OF THE PREFERRED EMBODIMENTS

Disclosed herein is an improved ESD event detector which overcomes the shortcomings of prior-art ESD event detectors. One such shortcoming is that existing ESD event detectors only provide a momentary indication of the existence of an ESD event. This indication is provided only during the time that the actual event is taking place. For example, the detector emits an audible beep or a flash of light in response to the detection of ESD. Therefore, a human operator must be present at the time that an ESD event triggers the detector, or else information as to the occurrence of an ESD event is lost. Moreover, prior art detectors provide no information about relative magnitudes of a plurality of ESD events, or about the number of ESD events that occur within a given period of time. Such information is critical in determining the relative effectiveness of various proposed methods of ESD mitigation in environments where electronic devices are assembled and used.

Another shortcoming of existing ESD detectors becomes evident when electromagnetic radiation generated by an ESD event is reflected from nearby conductive objects. This produces a received signal waveform having a plurality of voltage peaks. Existing ESD detectors may interpret each voltage peak as a separate ESD event when, in fact, these peaks all represent a single ESD event. This shortcoming is overcome in the ESD event detector disclosed herein through the use of signal processing techniques.

Figure 1:
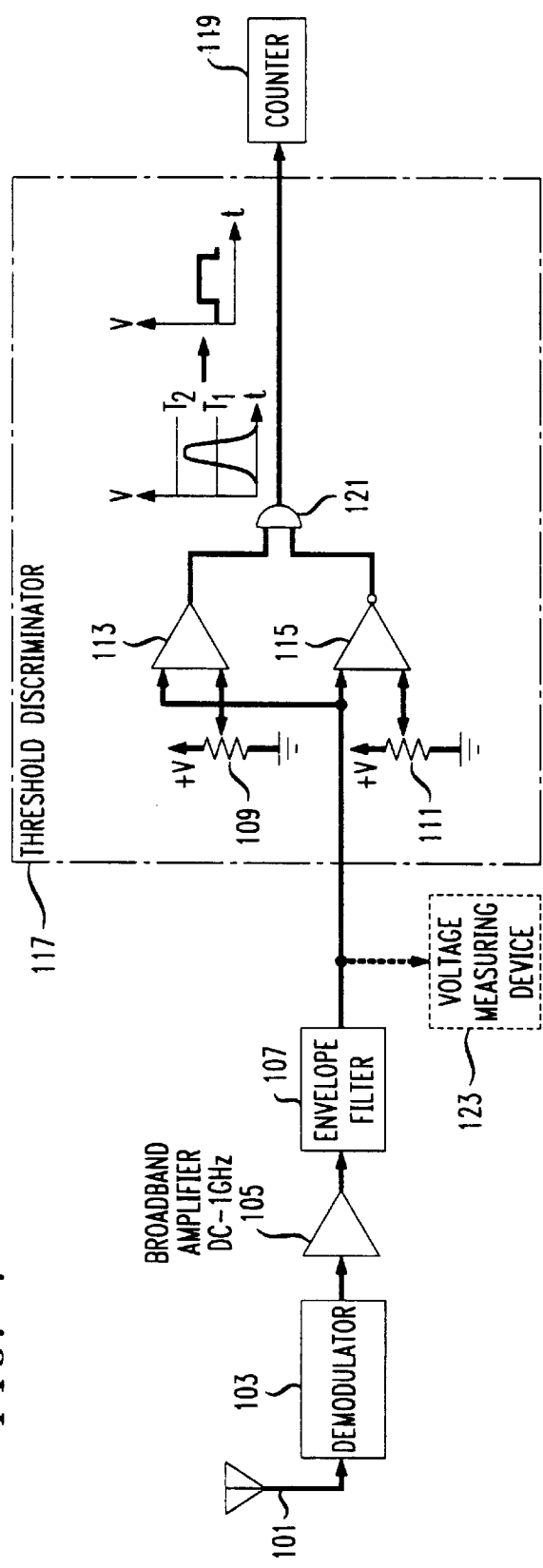
FIG. 1 is a hardware block diagram of an ESD event detector constructed in accordance with an embodiment disclosed herein.

FIG. 1 is an ESD event detector constructed in accordance with a first preferred embodiment disclosed herein. An antenna 101 produces a signal waveform in response to electromagnetic fields incident thereupon. Although virtually any type of antenna could be used for antenna 101, as a practical matter, it would be desirable to use an antenna of sufficiently small dimensions so that the ESD event detector lends itself to convenient use and/or portability. Due to the fact that ESD events produce broadband, impulse-like electromagnetic radiation in the frequency band from a few Hz all the way up to about 1 GHz, conventional antenna designs could be used to receive such radiation. However, the broad frequency spectrum of an ESD event is well-received by an antenna having a relatively wide bandwidth. Taking all of the foregoing considerations into account, one illustrative type of antenna for use as antenna 101 consists of a loop of wire, the electrical length of which is approximately one wavelength at 1 GHz.

Antenna 101 is coupled to an envelope demodulator which, in the present example, consists of a demodulator 103, a broadband amplifier 105, and an envelope filter 107. Note that broadband amplifier 105 is shown for illustrative purposes, it being understood that the demodulator 103 may alternatively be directly coupled directly to envelope filter 107 if broadband amplifier 105 is not used. If broadband amplifier 105 is used, note that the broadband amplifier 105 could alternatively be placed between antenna 101 and demodulator 103 or, still alternatively, be placed after envelope filter 107.

In the example of FIG. 1, antenna 101 is coupled to demodulator 103. Demodulator 103 performs the function of producing a waveform that is related to the envelope of the signal received by antenna 101. A conventional AM (amplitude-modulation) detector could, therefore, be employed to implement demodulator 103. However, in order to respond effectively to ESD events, demodulator 103 may be configured to have a relatively broadband response, for example, from 0 to 1 GHz. Demodulator 103 may be implemented, for example, using a Schottky barrier diode, a hot-carrier diode, a microwave diode, or a high-frequency transistor.

The envelope waveform produced by demodulator 103 is amplified by a broadband amplifier 105. In the present example, broadband amplifier 105 amplifies signals in the range of about 0 to 1 GHz. Although FIG. 1 shows a broadband amplifier 105 having the capability of amplifying all the way down to DC, this is not required, and conventional amplifiers having low cutoff frequencies in the range of Hz or KHz could also be employed.

The amplified envelope waveform is fed to an envelope filter 107. Envelope filter 107 is a lowpass filter which removes relatively rapidly-varying frequency components from the amplified envelope waveform, effectively smoothing the envelope. An illustrative envelope filter 107 is a lowpass filter having a cutoff frequency of about 90 Mhz. This envelope filter 107 processes amplified envelope waveforms so as to distinguish a waveform representing a single ESD event from waveforms representing multiple ESD events and waveforms that do not represent ESD events. Therefore, the time constant of the envelope filter is selected to be sufficiently lengthy so as to filter out short-duration, high-amplitude noise spikes. However, the time constant should be sufficiently short so as to properly distinguish a waveform generated by one ESD event from a multiplicity of waveforms generated by multiple ESD events. In the present example, a lowpass filter having a cutoff frequency of about 90 Mhz meets the aforementioned objectives. Of course, other filter cutoff frequencies are also useful for this purpose.

The output of envelope filter 107 is coupled to a threshold discriminator 117. Threshold discriminator 117 generates an indication signal in the form of a first output voltage if the output of the envelope filter 107 is between a first threshold T1 voltage and a second threshold T2 voltage. Otherwise, threshold discriminator 117 generates a second output voltage which may be conceptualized as the absence of an indication signal. Moreover, the first output voltage may represent a logic "high", and the second output voltage may represent a logic "low". One illustrative example of an indication signal is a voltage pulse.

In the example of FIG. 1, the threshold discriminator 117 includes a first potentiometer 109, a second potentiometer 111, a first comparator 113 which is a non-inverting comparator, a second comparator 115 which is an inverting comparator, and an AND gate 121. The output of envelope filter 117 is coupled to a first input of first comparator 113, and also to a first input of second comparator 115. A second input of the first comparator 113 is connected to a first adjustable voltage source which, in the present example, is first potentiometer 109. A second input of the second comparator 115 is connected to a second adjustable voltage source, represented by second potentiometer 111. First potentiometer 109 is adjusted to apply a first reference voltage to first comparator 113, and second potentiometer 111 is adjusted to apply a second reference voltage to second comparator. These reference voltages determine the first and second thresholds T1 and T2 referred to above. Note that these thresholds are also shown within the threshold discriminator 117 block of FIG. 1.

The outputs of the first comparator 113 (non-inverted) and second comparator 115 (inverted) are coupled to the inputs of an AND gate 121. The AND gate 121 generates a logic "high" (i.e., a high output voltage) when the voltage at the output of the envelope filter 107 is between the first threshold T1 and the second threshold T2. This logic "high" may be in the form of a voltage pulse. Otherwise, the AND gate 121 generates a logic "low" (i.e., a low output voltage).

The output of the threshold discriminator 117 is coupled to a counter 119, which counts the number of times that the output of the AND gate 121 changes from a logic "low" to a logic "high". In this manner, the counter 119 is triggered by the leading edges of the voltage pulses at the output of threshold discriminator 117. However, the counter 119 could, alternatively, be triggered by the trailing edges of the voltage pulses at the output of the threshold discriminator 117, such that the counter 119 counts the number of times that the output of the AND gate 121 changes from a logic "high" to a logic "low". Even though the configuration of FIG. 1 shows one counter 119, a plurality of counters may be employed, wherein each counter has its own associated threshold discriminator. Each threshold discriminator could optionally be set to a different first and/or second threshold to thereby identify ESD events of different magnitudes. The relative frequency of occurrence of ESD events in different amplitude ranges can then be displayed using multiple counters.

Although FIG. 1 shows a threshold discriminator 117 implemented using first and second comparators 113, 115, potentiometers 109, 111, and gate 121, this is for purposes of illustration. Other circuit configurations could alternatively be employed to implement threshold discriminator 117. One suitable circuit configuration would, for example, be equipped to generate a voltage pulse in response to an input signal that has an instantaneous amplitude between a first threshold T1 and a second threshold T2, where T1 is closer to zero than T2. During the times that the absolute value of an input signal has an instantaneous amplitude below first threshold T1, or above second threshold T2, such a circuit configuration would not generate an output pulse.

The output of the envelope filter 107 may be coupled to an optional voltage measuring device 123 equipped to measure and/or record voltages. In this manner, the relative amplitudes of a plurality of ESD events may be ascertained. Voltage measuring device 123 could represent, for example, a simple voltmeter, a chart recorder, an LED bar graph indicator, and/or a voltmeter equipped to interface with a serial and/or parallel port of a personal computer. If devices such as a chart recorder and/or a personal computer are employed, the relative amplitudes of a plurality of ESD events may be plotted as a function of time.

FIGS. 2A–2D show illustrative voltage waveforms at selected points in the hardware block diagram of FIG. 1.

Figure 2A:
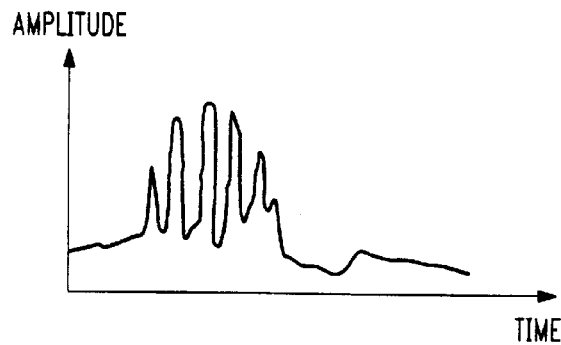
FIGS. 2A–2D are graphs showing voltage waveforms for the ESD event detector of FIG. 1.

FIG. 2A shows an illustrative voltage waveform which is present at antenna 101 when a single ESD event occurs. In free space, the waveform of FIG. 2A would show only one amplitude peak, representing the electromagnetic pulse generated by the ESD event. The multiple peaks of the waveform of FIG. 2A result when the electromagnetic pulse is reflected by various objects in the vicinity of the ESD event, and antenna 101 then receives the direct pulse from the ESD event, along with one or more reflected pulses slightly offset in time from the direct pulse. Therefore, an ESD event detector should be designed to characterize the waveform of FIG. 2A as representing a single ESD event, and not as representing multiple ESD events.

Figure 2B:
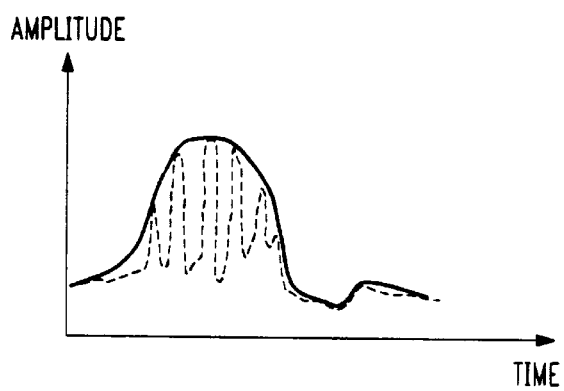

FIG. 2B shows an illustrative waveform that is present at the output of demodulator 103. This waveform is basically the envelope of the waveform shown in FIG. 2A. The waveform of FIG. 2B may be generated, for example, any applying the waveform of FIG. 2A to a conventional amplitude-modulation detector circuit such as a semiconductor diode. Ideally, such a diode should be equipped to detect relatively high-frequency signals up to, for example, 1 GHz. Suitable diodes include, for example, Schottky-barrier diodes and/or hot-carrier diodes. The envelope detector removes the rapid voltage fluctuations from the waveform of FIG. 2A, effectively "smoothing" the waveform.

Figure 2C:
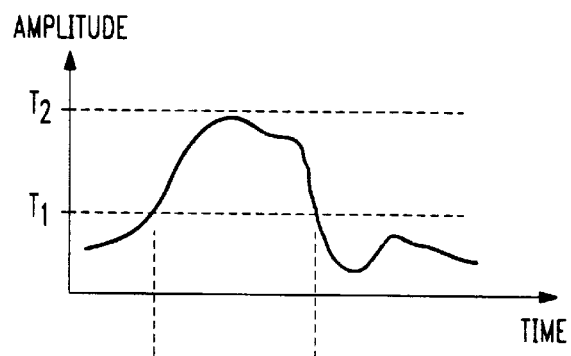

FIG. 2C shows the waveform of FIG. 2B, to which two voltage thresholds, T2 and T1, are applied. Voltage levels between first threshold T1 and second threshold T2 represent the voltage window considered to be representative of ESD events to be detected. First threshold T1 is selected so as to represent the minimum voltage level considered to be representative of an ESD event, and is generally selected to be above the noise level in a given system. Second threshold T2 is selected to represent the maximum voltage level considered to be representative of an ESD event, and effectively performs the function of a peak limit. ESD events producing voltage levels above T2 will, therefore, be limited to a maximum amplitude of T2, to enable detection of relatively high-magnitude ESD events without placing undue voltage-handling demands on system components.

Figure 2D:
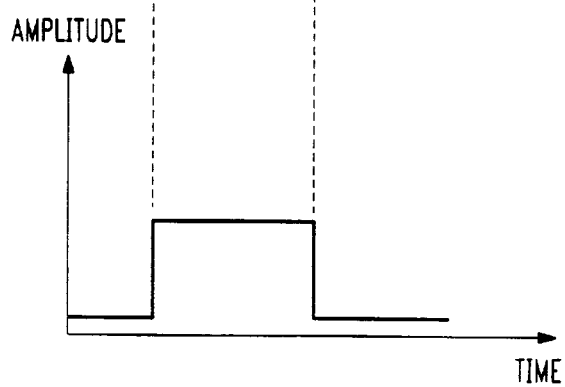

FIG. 2D represents the output of threshold discriminator 117 (FIG. 1) that is generated in response to the waveform of FIG. 2C. Initially, the waveform of FIG. 2C is below first threshold T1 and, therefore, the output of threshold discriminator 117 (FIG. 1) is at a low logic level, i.e., zero. When the waveform of FIG. 2C first crosses the first threshold T1, the output of threshold discriminator 117 (FIG. 1) changes from a low logic level to a high logic level. The output of threshold discriminator 117 is at a high logic level during the time that the waveform of FIG. 2C is above the second threshold. The output of threshold discriminator 117 remains at a high logic level until the waveform of FIG. 2C again drops below the first threshold T1.

Figure 3:
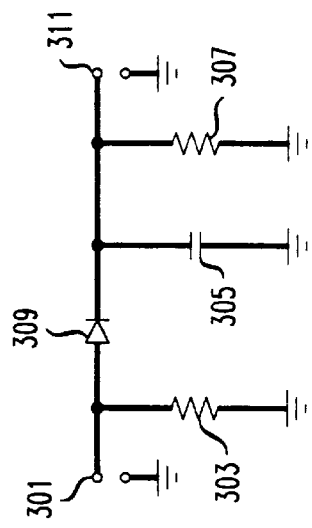
FIG. 3 is a schematic diagram of an illustrative envelope filter for use in the ESD event detector of FIG. 1.

FIG. 3 is a schematic diagram of an illustrative filter for use as the envelope filter 107 of FIG. 1. One purpose of the envelope filter is to remove relatively rapid fluctuations from the signal produced by broadband amplifiers 105. The envelope filter of FIG. 3 effectively smoothes waveforms that are received by antenna 101 so that a multiplicity of received pulses from a single ESD event are properly characterized as representing that ESD event, and not as representing multiple ESD events. However, the response time of the filter of FIG. 3 is selected to be sufficiently fast so that a multiplicity of received pulses representing multiple ESD events are interpreted properly.

Input port 301 of the envelope filter of FIG. 3 is coupled to a shunt resistor 303 and to the anode terminal of a series diode 309. Alternatively, the input port 301 could be coupled to shunt resistor 303 and the cathode terminal of series diode 309. The value of the shunt resistor is selected to be at or close to the desired input impedance of the filter. For example, if the desired input impedance is 50 ohms, the nearest standard-value resistor of 51 ohms could be employed.

Diode 309 is equipped to rectify relatively high-frequency waveforms of at least 100 Mhz. Suitable diodes for use as diode 309 include Schottky diodes, hot-carrier diodes, and any of various Germanium point-contact diodes. The cathode of diode 309 (or, alternatively, the anode of diode 309) is coupled to a shunt capacitance 305 in parallel with a shunt resistance 307. In order to provide an envelope filter with the desired frequency response characteristics so as to properly distinguish single ESD events from multiple ESD events, the value of shunt capacitance 305 is about 20 picofarads, and the value of shunt resistor 307 is about 510 ohms. Output port 311 is coupled to diode 309, shunt resistor 307, and shunt capacitor 305.

We claim:

1. An electrostatic discharge (ESD) event detector comprising:

an antenna, a demodulator for generating an envelope waveform that is related to the envelope of signals received by the antenna, a discriminator for generating an indication signal when the envelope waveform has a magnitude between a first and a second threshold, and a counter for counting each indication signal.

2. The electrostatic discharge (ESD) event detector of claim 1 wherein the discriminator generates an indication signal when the envelope waveform has an instantaneous amplitude between a first and a second threshold.

3. The electrostatic discharge (ESD) event detector of claim 1 further comprising an amplitude detection device, coupled to the demodulator, for measuring the relative amplitudes of a plurality of ESD events.

4. The electrostatic discharge (ESD) event detector as set forth in claim 3 wherein the amplitude detection device is a recorder for recording the occurrence of an indication signal.

5. The electrostatic discharge (ESD) event detector as set forth in claim 4 wherein the amplitude detection device is a chart recorder.

6. The electrostatic discharge (ESD) event detector as set forth in claim 3 wherein the amplitude detection device is a chart recorder for recording voltage as a function of time.

7. The electrostatic discharge (ESD) event detector of claim 3 wherein the amplitude detection device is a voltmeter coupled to a personal computer for recording occurrences of indication signals.

8. A method of detecting electrostatic discharge (ESD) events comprising the steps of:

receiving a signal waveform on an antenna, generating an envelope waveform related to the envelope of the signal waveform, generating an indication signal only when the envelope waveform has an instantaneous amplitude between a first and a second threshold, and counting the indication signals.

9. The method of claim 8 wherein the step of generating an envelope waveform is performed using a demodulator coupled to the antenna.

10. The method of claim 8 wherein the step of generating an indication signal is performed using a discriminator.

11. The method of claim 8 wherein the step of counting is performed using a counter.

12. The method of claim 8 wherein the step of generating an envelope waveform is performed using a demodulator coupled to the antenna, the step of generating an indication signal is performed using a discriminator, and the step of counting is performed using a counter.

13. The method of claim 8 further comprising the step of measuring the relative amplitudes of a plurality of ESD events.

14. The method of claim 13 wherein the step of measuring the relative amplitudes is performed using a recorder for recording the occurrence of an indication signal.

15. The method of claim 13 wherein the step of measuring the relative amplitudes is performed using a meter coupled to a personal computer for recording a signal measured by the meter as a function of time.

16. The ESD event detector of claim 1 wherein the antenna comprises a tuned loop.

17. The method of claim 8 wherein the antenna comprises a tuned loop.

18. The ESD event detector of claim 1 wherein the demodulator includes an envelope filter having a time constant sufficiently lengthy so as to distinguish a first waveform representing a single ESD event from a second waveform representing a plurality of ESD events.

19. The ESD event detector of claim 1 wherein the demodulator includes an envelope filter having a time constant sufficiently lengthy so as to substantially filter out noise spikes.

20. The ESD event detector of claim 18 wherein the envelope filter is a lowpass filter.

21. The ESD event detector of claim 20 wherein the lowpass filter has a cutoff frequency of about 90 Mhz.

22. The ESD event detector of claim 1 wherein the antenna is a tuned antenna.

23. The ESD event detector of claim 1 wherein the antenna is tuned to a frequency at which an ESD event produces electromagnetic radiation.

24. The ESD event detector of claim 23 wherein the antenna is tuned to a frequency of approximately 1 Ghz.

25. The ESD event detector of claim 1 wherein the first and second thresholds define an amplitude window corresponding to a range of amplitudes representative of ESD events to be detected.

26. The ESD event detector of claim 25 wherein the first threshold is selected to represent a minimum voltage level representative of ESD events to be detected.

27. The ESD event detector of claim 25 wherein the antenna is tuned to a frequency at which an ESD event produces electromagnetic radiation.

28. The ESD event detector of claim 25 wherein the antenna is tuned to a frequency of approximately 1 Ghz.

29. The ESD event detector of claim 25 wherein the demodulator includes an envelope filter having a time constant sufficiently lengthy so as to distinguish a first waveform representing a single ESD event from a second waveform representing a plurality of ESD events.

30. An ESD event detector CHARACTERIZED BY:
(a) an antenna tuned to a frequency at which an ESD event produces electromagnetic radiation;
(b) an envelope filter for processing electromagnetic energy received by the antenna and having a time constant sufficiently lengthy so as to distinguish a first waveform representing a single ESD event from a second waveform representing a plurality of ESD events,
(c) the envelope filter providing an envelope output, and the ESD event detector further characterized by a threshold discriminator which generates an indication signal when the envelope waveform has a magnitude between a first and a second threshold, the first and second thresholds defining an amplitude window corresponding to a range of amplitudes representative of ESD events to be detected.

* * * * *